United States Patent
Cathelin et al.

(10) Patent No.: US 6,870,427 B2
(45) Date of Patent: Mar. 22, 2005

(54) PROCESS AND DEVICE FOR CONTROLLING THE OPERATION OF A BIPOLAR TRANSISTOR IN CLASS A

(75) Inventors: Philippe Cathelin, Laval (FR); Jean-Charles Grasset, Moirans (FR)

(73) Assignee: STMicroelectronics S.A. (FR)

( * ) Notice: Subject to any disclaimer, the term of this patent is extended or adjusted under 35 U.S.C. 154(b) by 0 days.

(21) Appl. No.: 10/401,510

(22) Filed: Mar. 27, 2003

(65) Prior Publication Data

US 2003/0213976 A1 Nov. 20, 2003

(30) Foreign Application Priority Data

Mar. 27, 2002 (FR) .......................................... 02 03806

(51) Int. Cl.[7] .................................................. H03F 3/04
(52) U.S. Cl. ............................................ 330/296; 330/85
(58) Field of Search ............................... 330/296, 285, 330/290, 300, 277, 85

(56) References Cited

U.S. PATENT DOCUMENTS

| | | | |
|---|---|---|---|
| 4,591,743 A | 5/1986 | Kung | ........................ 307/491 |
| 5,760,651 A * | 6/1998 | Wong | ........................ 330/296 |
| 6,271,721 B1 | 8/2001 | Trask | ........................ 327/560 |
| 6,509,722 B2 * | 1/2003 | Lopata | ........................ 323/280 |
| 6,617,928 B2 * | 9/2003 | Finlay et al. | ................ 330/288 |

FOREIGN PATENT DOCUMENTS

WO   WO 98/05118   2/1998

OTHER PUBLICATIONS

French Search Report, FA 617420/FR 0203806, dated Dec. 19, 2002.

* cited by examiner

Primary Examiner—Henry Choe
(74) Attorney, Agent, or Firm—Jenkens & Gilchrist, P.C.

(57) ABSTRACT

The operation of a bipolar transistor is controlled comprising by producing a first voltage that is a product of a static collector current of the bipolar transistor times an emitter resistance. The first voltage is then compared to a predetermined reference voltage to produce a control signal. Current is then injected a base of the bipolar transistor in response to the control signal. In a specific implementation, the first voltage, which is a product of the static collector current (Ic) of the bipolar transistor times its emitter resistance (RE), is slaved to a predetermined reference voltage (Vref) whose value is substantially equal, to within a tolerance, to 13 mV at a temperature at or about 27° C.

23 Claims, 1 Drawing Sheet

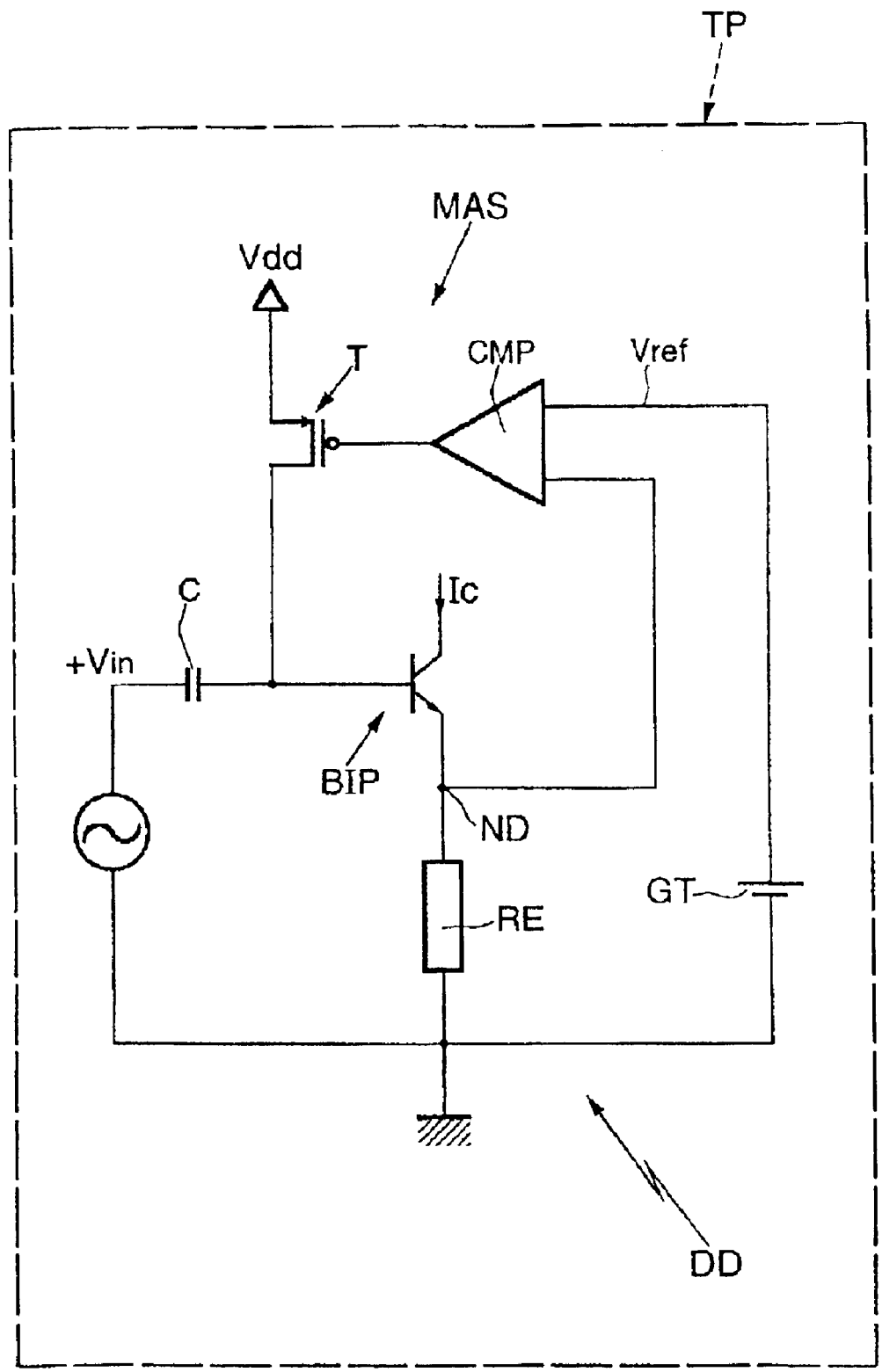

US 6,870,427 B2

PROCESS AND DEVICE FOR CONTROLLING THE OPERATION OF A BIPOLAR TRANSISTOR IN CLASS A

PRIORITY CLAIM

The present application claims foreign priority from French Application for Patent No. 02 03806 filed Mar. 27, 2002, the disclosure of which is hereby incorporated by reference.

BACKGROUND OF THE INVENTION

1. Technical Field of the Invention

The present invention relates to bipolar transistors and, more particularly, to controlling the operation of those transistors in class A mode, according to either a common emitter or common base arrangement. The invention applies advantageously, without limitation, to terminals of wireless communication systems, for example, to cellular mobile telephones.

2. Description of Related Art

A bipolar transistor operating in class A mode according to a common emitter arrangement is customarily used as a transconductor stage, that is to say a voltage/current converter. Such a transconductor is characterized in particular by its linearity and its gain. The linearity can be conveyed by the value, in dBm, of an order 3 interception point (IIP3) for a dual-tone intermodulation test, according to terminology well known to the person skilled in the art. The higher the value of this point, the lower the intermodulation (which is conveyed by the appearance of intermodulation lines) and consequently the better the linearity of the transconductor stage.

During the design of such transconductor stages, the gain and the intermodulation form part of the specified parameters.

In order to improve the linearity of a transconductor stage, it is customary to connect a so-called "degeneracy" resistor between the emitter of the bipolar transistor and earth/ground. The gain $g_m$ of the transconductor stage is equal to the gain $g_{m0}$ of the bipolar transistor proper, divided by $(1+g_{m0}RE)$, where RE denotes the emitter resistance, that is to say the degeneracy resistance. The linearity of the transconductor will improve by increasing this resistance. However, to increase the linearity at constant $g_m$, it is additionally necessary to increase $g_{m0}$. This value $g_{m0}$ is thus proportional to the static collector current flowing through the bipolar transistor in the absence of any input signal.

Consequently, the increase in the emitter resistance RE will ultimately be conveyed through an increase in the value of this static collector current, that is to say through an increase in the consumption of current.

Hence, a compromise between linearity and current consumption is envisaged, at present, during the design of such transconductor stages. Also, all the transconductor stages generally exhibit an IcRE product equal to around 100 mV, Ic denoting the static collector current.

The invention aims to afford a solution to this problem.

SUMMARY OF THE INVENTION

An objective of the invention is to propose a bipolar transistor operating in class A mode, according to either a common emitter or common base arrangement, which exhibits very good linearity together with reduced current consumption as compared with a conventional arrangement with identical gain.

The invention proposes a process for controlling the operation of a bipolar transistor operating in class A mode, according to either a common emitter or common base arrangement, in which the product of the static collector current times the emitter resistance is slaved to a predetermined reference voltage whose value is substantially equal, within a given tolerance, to 13 mV at the temperature of 27° C.

The inventors have indeed observed surprisingly that this reference voltage makes it possible to obtain an extremely large value of IIP3, and consequently obtain very good linearity, substantially irrespective of the other operating parameters of the transistor, and in particular its gain, when it is used in a common-emitter arrangement.

Moreover, it has also been observed that with respect to a conventional arrangement not slaved to this value of 13 mV, the consumption of current, that is to say the collector static current, is less than half the collector current obtained for a conventional arrangement such as this, with identical gain.

It is moreover especially advantageous for the reference voltage to be delivered by a generator of the proportional to absolute temperature type (PTAT generator). Such a generator makes it possible to render the performance thus obtained almost independent of temperature.

The subject of the invention is also an electronic device comprising:

an input for receiving an input signal, a bipolar transistor able to operate in class A mode, according to either a common emitter or common base arrangement, linked to the input and able to deliver on its collector an output current, a voltage generator able to deliver a predetermined reference voltage whose value is substantially equal, to within a given tolerance, to 13 mV at a temperature at or about 27° C., and slaving means able to slave the product of the static collector current times the emitter resistance to the said reference voltage.

The voltage generator is advantageously of the proportional to absolute temperature type.

According to an embodiment of the invention, the slaving means are fed back between the emitter and the base of the bipolar transistor.

The output impedance of the slaving loop is preferably selected to be large compared with the impedance viewed from the base of the transistor, for example 100 times larger. This makes it possible, in particular when the transistor is used in a common emitter arrangement, for the input current not to be injected into the slaving loop.

Moreover, it is also especially advantageous for the gain of the slaving loop at the operating frequency and at Δf, where Δf designates the frequency separation between the two tones of a dual-tone intermodulation test, to be small relative to 1. It will for example be possible to choose a gain equal to $1/100$. Stated otherwise, the passband of the slaving loop is then much less than the useful frequency of the input signal. Thus, the gain of the device remains essentially equal to the gain of the transistor associated with its emitter resistance, the influence of the gain of the slaving loop being negligible.

According to an embodiment, the slaving means comprise a differential amplifier, a first input of which is connected to the emitter of the transistor, a second input of which is connected to the output of the reference voltage generator, and the output of which is connected to the gate of a MOS transistor, for example a PMOS transistor, itself connected between the supply voltage and the base of the bipolar transistor.

The device according to the invention is advantageously embodied in integrated form.

The subject of the invention is also a remote terminal of a wireless communication system, in particular a cellular mobile telephone, incorporating a radio frequency reception stage comprising a device as defined hereinabove.

In an implementation of the present invention, a circuit and method are provided wherein operation of a bipolar transistor is controlled. A first voltage is produced which is a product of a static collector current of the bipolar transistor times an emitter resistance. The first voltage is then compared to a predetermined reference voltage to produce a control signal. Current is then injected a base of the bipolar transistor in response to the control signal.

BRIEF DESCRIPTION OF THE DRAWINGS

A more complete understanding of the method and apparatus of the present invention may be acquired by reference to the following Detailed Description when taken in conjunction with the accompanying Drawings wherein the sole FIGURE diagrammatically represents an embodiment of a device according to the invention.

DETAILED DESCRIPTION OF THE DRAWINGS

In the FIGURE, the reference TP denotes a cellular mobile telephone whose reception chain, for example, incorporates a device DD according to the invention.

This device comprises a bipolar transistor BIP arranged in common emitter mode, that is to say the radio frequency input signal, which here is an input voltage Vin, is received on the base of this bipolar transistor BIP, via a decoupling capacitor C.

An emitter resistance RE is moreover connected between the emitter of the bipolar transistor and earth/ground.

The output current from this transconductor stage is the collector current of the bipolar transistor. Of course, the collector of the transistor is linked to the supply voltage through an output load, for example a mixer, not represented here for the sake of simplification.

The device DD according to the invention moreover comprises slaving means MAS fed back between the emitter and the base of the bipolar transistor BIP.

These slaving means MAS here comprise a differential amplifier CMP, a first input of which is linked to the emitter of the transistor BIP at a point ND situated between this emitter and the emitter resistance RE.

The other input of the differential amplifier CMP receives a predetermined reference voltage Vref delivered by a voltage generator GT of the proportional to absolute temperature type (PTAT).

The output of the differential amplifier CMP is linked to the gate of a PMOS transistor referenced T, whose source is linked to the supply voltage Vdd and whose drain is linked to the base of the bipolar transistor BIP.

The bipolar transistor BIP operates in class A mode. Stated otherwise, the dynamic output current of the transistor, that is to say when the input signal +Vin is present, is a sinusoid whose frequency is equal to the useful frequency of the input signal, this sinusoid being centered on the level corresponding to the static collector current of the bipolar transistor. Moreover, since the transistor operates in class A mode, the dynamic output current is not clipped, and the amplitude of this dynamic current relative to the level of the collector static current remains less than the level of this collector static current, and the mean current level is equal to the static current.

The current flowing at the node ND, that is to say the emitter current of the bipolar transistor, is to within the current gain β of the transistor, substantially equal to the collector current Ic. The mean voltage at the node ND is therefore substantially equal to the product of the emitter resistance times the static collector current Ie.

Moreover, the gain of the device DD is equal to $g_m/(1+A)$, where $g_m$ denotes the gain of the bipolar transistor BIP associated with its emitter resistance RE, and A denotes the gain of the slaving loop MAS. A gain of the slaving loop which is as low as possible at the useful frequency of the input signal and at the separation Δf of the tones of a dual-tone intermodulation test will therefore preferably be chosen, so as to have a passband of the differential amplifier which is much less than the useful frequency. By way of indication, it will be possible to take A of the order of 1/100.

Finally, owing to the presence of the transistor T, the output impedance of the slaving loop MAS is very large compared with the impedance viewed from the base of the bipolar transistor BIP. Therefore, the input current is almost totally injected into the base of the bipolar transistor BIP.

The voltage source GT is a voltage source proportional to absolute temperature. The structure of a conventional voltage source such as this is well known to the person skilled in the art. In this instance, this voltage source is scheduled to deliver a reference voltage Vref equal to 13 mV at the temperature of 27° C. More generally, the voltage Vref in millivolts is equal to 13 (t+273)/(27+273) where "t" denotes the temperature in degrees Celsius.

Hence, during operation, the mean voltage at the node ND is constantly slaved to the reference voltage Vref, to within the offset voltage of the differential amplifier CMP. More precisely, the loop will find its equilibrium when Vref and the mean voltage at the node ND are equal to within the offset voltage.

Thus, regardless of the desired gain of the device DD, the IIP3 is theoretically infinite when the voltage at the node ND is strictly equal to 13 mV. In practice, this voltage is equal to 13 mV, to within a tolerance, for example plus or minus 5%, by virtue of the offset voltage of the differential amplifier CMP. Under these conditions, the level of intermodulation nevertheless remains very low, and consequently the value of the IIP3 remains very high. Very good linearity of this transconductor device is therefore obtained.

In parallel with this, for a gain $g_m$ equal to 56 mS, and a resistance RE of the order of 4 to 5 Ohms, a collector static current of the order of 2.2 mA is obtained instead of 6 mA in a conventional arrangement, that is to say without any slaving of the emitter voltage to 13 mV.

Moreover, the device DD exhibits low noise without degradation of the 1 dB compression point. It is recalled here that the compression point of an amplifier stage is the input power beyond which the corresponding output power deviates by 1 dB from the theoretical output power corresponding to linear operation of the stage.

The invention is not limited to the embodiment just described but embraces all the variants thereof. Thus, the same principle can be applied to a common-base arrangement, in which the input signal, which is now a current, is applied directly to the emitter of the bipolar transistor. The slaving means MAS remain fed back between the emitter and the base. A device is then embodied which allows a transfer of impedance between the input and the output, doing so with excellent linearity.

Moreover, although an embodiment with single input has been described hereinabove, the invention applies also to a differential structure.

Furthermore, other embodiments of the slaving loop are possible, for example by fixing the voltage of the base and by controlling the emitter voltage.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for controlling the operation of a bipolar transistor operating in class A mode, according to a common emitter or common base arrangement, wherein the product of a static collector current (Ic) times an emitter resistance (RE) is slaved to a predetermined reference voltage (Vref) whose value is substantially equal, to within a tolerance, to 13 mV at a temperature at or about 27° C., wherein the reference voltage is delivered by a generator (GT) of the proportional to absolute temperature type.

2. An electronic device, comprising an input for receiving an input signal (+Vin), a bipolar transistor (BIP) able to operate in class A mode according to either a common emitter or common base arrangement, linked to the input and able to deliver on its collector an output current, a voltage generator (GT) able to deliver a predetermined reference voltage whose value is substantially equal, to within a tolerance, to 13 mV at a temperature at or about 27° C., and slaving means (MAS) able to slave the product of the static collector current times the emitter resistance to the said reference voltage, wherein the voltage generator (GT) is of the proportional to absolute temperature type.

3. The device according to claim 2, wherein the slaving means (MAS) provides feed back between the emitter and the base of the bipolar transistor.

4. The device according to claim 3, wherein an output impedance of the slaving loop (MAS) is large compared with an impedance viewed from the base of the transistor, for example, about 100 times larger.

5. The device according to claim 3, wherein a gain of the slaving loop (MAS) at a useful frequency of the input signal and at a separation f of the tones of a dual-tone intermodulation test, is small relative to 1, for example, equal to about $1/100$.

6. The device according to claim 4, wherein the slaving means comprise a differential amplifier (CMP), a first input of which is connected to the emitter of the transistor, a second input of which is connected to the output of the reference voltage generator, and the output of which is connected to the gate of a MOS transistor (T) itself connected between the supply voltage and the base of the bipolar transistor.

7. The device according to claim 2, wherein the device is embodied in integrated form.

8. The device according to claim 2 wherein the device is incorporated within a remote terminal of a wireless communication system, in particular a cellular mobile telephone.

9. A circuit, comprising:
a bipolar transistor including a base, emitter and collector;
a resistor connected between the emitter and a first reference voltage;
a field effect transistor having a gate and first and second terminals, a first of those terminals connected to the base and a second of those terminals connected to a second reference voltage;
a voltage generator outputting a third reference voltage; and
a differential amplifier having a first input connected to the emitter of the bipolar transistor and a second input connected to the voltage generator, and having an output connected to the gate of the field effect transistor;
wherein the voltage generator produces a substantially constant third reference voltage irrespective of temperature.

10. The circuit of claim 9 wherein the bipolar transistor operates in class A mode.

11. The circuit of claim 9 wherein the field effect transistor is a pMOS device.

12. The circuit of claim 9 wherein the voltage generator comprises a proportional to absolute temperature type generator.

13. The circuit of claim 9, wherein the third reference voltage is substantially equal, to within a tolerance, to 13 mV at a temperature at or about 27° C.

14. A process for controlling the operation of a bipolar transistor comprising the steps of:
producing a first voltage that is a product of a static collector current of the bipolar transistor times an emitter resistance;
comparing the first voltage to a predetermined reference voltage to produce a control signal in response to the comparison; and
injecting current into a base of the bipolar transistor in response to the control signal;
wherein the reference voltage has a value that is substantially constant independent of temperature.

15. The method of claim 14 wherein the bipolar transistor operates in class A mode according to a common emitter arrangement.

16. The method of claim 14 wherein the reference voltage value is substantially equal, to within a tolerance, to 13 mV at a temperature at or about 27° C.

17. The method of claim 14 wherein the bipolar transistor operates in class A mode.

18. An integrated circuit comprising:
a bipolar transistor having a base and an emitter;
a resistor connected at a node to the emitter to produce at the node a first voltage that is a product of a static collector current of the bipolar transistor times a resistance of the resistor;
a comparator that compares the first voltage to a predetermined reference voltage to produce a control signal in response to the comparison; and
an injection circuit operable to inject current into the base of the bipolar transistor in response to the control signal;
wherein the reference voltage has a value that is substantially constant independent of temperature.

19. The integrated circuit of claim 18 wherein the injection circuit comprises a field effect transistor having a gate and first and second terminals, a first of those terminals connected to the base of the bipolar transistor.

20. The integrated circuit of claim 18 wherein the bipolar transistor has a common emitter configuration.

21. The integrated circuit of claim 18 wherein the reference voltage value is substantially equal, to within a tolerance, to 13 mV at a temperature at or about 27° C.

22. The integrated circuit of claim 18 wherein the reference voltage is generated by a proportional to absolute temperature type generator.

23. The integrated circuit of claim 18 wherein the bipolar transistor operates in class A mode.

* * * * *